United States Patent
Wu et al.

(10) Patent No.: US 9,647,049 B2
(45) Date of Patent: May 9, 2017

(54) OLED PIXEL STRUCTURE

(71) Applicant: Shenzhen China Star Optoelectronics Technology Co., Ltd., Shenzhen (CN)

(72) Inventors: Yuanchun Wu, Shenzhen (CN); Xiaoling Wu, Shenzhen (CN); Shipeng Chi, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 97 days.

(21) Appl. No.: 14/655,735

(22) PCT Filed: Apr. 1, 2015

(86) PCT No.: PCT/CN2015/075691
§ 371 (c)(1),
(2) Date: Jun. 26, 2015

(87) PCT Pub. No.: WO2016/119306
PCT Pub. Date: Aug. 4, 2016

(65) Prior Publication Data
US 2016/0307983 A1    Oct. 20, 2016

(30) Foreign Application Priority Data

Jan. 28, 2015   (CN) .......................... 2015 1 0044960

(51) Int. Cl.
*H01L 27/32*    (2006.01)
*H01L 51/52*    (2006.01)

(52) U.S. Cl.
CPC ...... *H01L 27/3265* (2013.01); *H01L 27/3211* (2013.01); *H01L 27/3216* (2013.01);
(Continued)

(58) Field of Classification Search
CPC .................................................. H01L 2251/303
See application file for complete search history.

(56) References Cited

U.S. PATENT DOCUMENTS 8,253,135 B2 *  8/2012  Uochi ................. G02F 1/13454
                                                    257/43
8,796,920 B2 *  8/2014  Han .................... H01L 51/5203
                                                    257/40

(Continued)

*Primary Examiner* — Caridad Everhart
*Assistant Examiner* — Ankush Singal
(74) *Attorney, Agent, or Firm* — Leong C. Lei

(57) ABSTRACT

The present invention provides an OLED pixel structure, comprising red, green, blue sub pixel areas, and the red, the green, the blue sub pixel areas respectively comprise a substrate, an anode formed on the substrate, a flat layer formed on the anode, an organic light emitting layer formed on the flat layer and a cathode formed on the organic light emitting layer, and an aperture area is formed on the flat layer, and the organic light emitting layer contacts the anode through the aperture area, and the anode comprises a positive electrode and a positive electrode compensation area coupled to the positive electrode, and the cathode, the positive electrode compensation area and a sandwiched layer between the cathode and the positive electrode compensation area constitute a compensation capacitor, and the compensation capacitor respectively makes total capacitance values of the red, green, blue sub pixel areas are equivalent to reach the capacitance value required by an drive circuit of the OLED element.

16 Claims, 2 Drawing Sheets

(52) U.S. Cl.
CPC ...... *H01L 51/5209* (2013.01); *H01L 51/5212* (2013.01); *H01L 27/3246* (2013.01); *H01L 2251/303* (2013.01); *H01L 2251/308* (2013.01); *H01L 2251/558* (2013.01)

(56) References Cited

U.S. PATENT DOCUMENTS

| | | | | |
|---|---|---|---|---|
| 8,816,579 B2* | 8/2014 | Kim | ............... | H01L 51/5215 257/88 |
| 8,890,166 B2* | 11/2014 | Sakakura | ............ | H01L 27/1225 257/72 |
| 9,111,891 B2* | 8/2015 | Isobe | ............... | H01L 51/5228 |
| 9,118,030 B2* | 8/2015 | Kim | ............... | H01L 51/5012 |
| 9,331,256 B2* | 5/2016 | Chien | ............... | H01L 33/62 |
| 2006/0035469 A1* | 2/2006 | Truong | ............... | H01L 27/3246 438/739 |
| 2006/0125381 A1* | 6/2006 | Oh | ............... | H01L 27/3246 313/504 |
| 2006/0181221 A1* | 8/2006 | Sato | ............... | H01L 27/156 315/169.3 |
| 2007/0141234 A1* | 6/2007 | Cheng | ............... | H01L 27/3246 427/64 |
| 2009/0140638 A1* | 6/2009 | Asano | ............... | G09G 3/3233 313/504 |
| 2009/0195483 A1* | 8/2009 | Naugler, Jr. | ......... | G09G 3/3233 345/76 |
| 2009/0295283 A1* | 12/2009 | Kim | ............... | H01L 27/322 313/504 |
| 2010/0060153 A1* | 3/2010 | Uchida | ............... | H05B 33/22 313/504 |
| 2010/0181559 A1* | 7/2010 | Nakatani | ............ | H01L 27/3246 257/40 |
| 2010/0231124 A1* | 9/2010 | Song | ............... | H01L 27/3276 313/504 |
| 2012/0175605 A1* | 7/2012 | Shin | ............... | H01L 27/3265 257/43 |
| 2013/0015453 A1* | 1/2013 | Sato | ............... | H01L 29/41733 257/59 |
| 2013/0048986 A1* | 2/2013 | Lee | ............... | H01L 51/5265 257/52 |
| 2013/0222217 A1* | 8/2013 | Shin | ............... | H01L 27/326 345/80 |
| 2013/0228801 A1* | 9/2013 | Lee | ............... | H01L 51/5268 257/88 |
| 2013/0307548 A1* | 11/2013 | Lee | ............... | H01L 27/124 324/414 |
| 2014/0054557 A1* | 2/2014 | Jung | ............... | H05K 7/06 257/40 |
| 2014/0159022 A1* | 6/2014 | Song | ............... | H01L 27/3248 257/40 |
| 2014/0291636 A1* | 10/2014 | Kim | ............... | H01L 27/3262 257/40 |
| 2014/0291685 A1* | 10/2014 | Kinoshita | ............ | H01L 27/3265 257/59 |
| 2014/0292622 A1* | 10/2014 | Lee | ............... | G09G 3/3233 345/80 |
| 2014/0353636 A1* | 12/2014 | Baek | ............... | H01L 27/3213 257/40 |
| 2015/0331508 A1* | 11/2015 | Nho | ............... | G06F 3/0421 345/173 |
| 2016/0064363 A1* | 3/2016 | Bower | ............... | H01L 25/167 315/294 |

* cited by examiner

1 …

OLED PIXEL STRUCTURE

FIELD OF THE INVENTION

The present invention relates to a display technology field, and more particularly to an OLED pixel structure.

BACKGROUND OF THE INVENTION

Organic Light Emitting Diode (OLED) is a flat panel display technology which has great prospects for development. It does not only possess extremely excellent display performance but also properties of self-illumination, simple structure, ultra thin, fast response speed, wide view angle, low power consumption and capability of realizing flexible display, and therefore is considered as "dream display". Meanwhile, the investment for the production equipments is far smaller than the Liquid Crystal Display (LCD). It has been favored by respective big display makers and has become the main selection of the third generation display element.

As shown in FIG. 1, it is a drive circuit diagram of an OLED according to prior art. In the OLED display device, each OLED element can be equivalent to a structure having a light emitting diode and a capacitor coupled in parallel, and the size of the capacitor coupled in parallel directly influences the voltage of two ends, the flowing through current value of the OLED, and accordingly influences the display quality of the entire OLED display device.

As shown in FIG. 2, it is a sectional diagram of an OLED pixel structure according to prior art. The OLED pixel structure comprises red, green, blue sub pixel areas, and the red, the green, the blue sub pixel areas respectively comprise a substrate 100, an anode 200 formed on the substrate 100, a flat layer 300 formed on the anode 200, an organic light emitting layer 400 formed on the flat layer 300 and a cathode 500 formed on the organic light emitting layer 400, and an aperture area 310 is formed on the flat layer 300, and the organic light emitting layer 400 contacts the anode 200 through the aperture area 310.

In the OLED pixel structure according to prior art, the light emitting materials, the aperture ratios and attenuations of the red, the green, the blue sub pixel areas are different and the total capacitance values of the red, the green, the blue sub pixel areas are different. Thus, the voltages of two ends of the OLEDs in the different sub pixel areas are different, and the brightnesses of the OLEDs in the different sub pixel areas are different, either. Accordingly, the performances of the OLED elements and the display quality of the entire display screen are influenced.

SUMMARY OF THE INVENTION

An objective of the present invention is to provide an OLED pixel structure, and the total capacitance values of the red, green, blue sub pixel areas in the OLED pixel structure are equivalent to reach the capacitance value required by the OLED drive circuit.

For realizing the aforesaid objective, the present invention provides an OLED pixel structure, comprising red, green, blue sub pixel areas, and the red, the green, the blue sub pixel areas respectively comprise a substrate, an anode formed on the substrate, a flat layer formed on the anode, an organic light emitting layer formed on the flat layer and a cathode formed on the organic light emitting layer, and an aperture area is formed on the flat layer, and the organic light emitting layer contacts the anode through the aperture area, and the anode comprises a positive electrode and a positive electrode compensation area coupled to the positive electrode, and the cathode, the positive electrode compensation area and a sandwiched layer between the cathode and the positive electrode compensation area constitute a compensation capacitor $C_p$, and the compensation capacitor $C_p$ respectively makes total capacitance values of the red/green/blue sub pixel areas are equivalent to reach the capacitance value $C_{total}$ required by an OLED drive circuit.

The sandwiched layer is the organic light emitting layer and the flat layer, and the cathode, the positive electrode compensation area and the organic light emitting layer and the flat layer between the cathode and the positive electrode compensation area constitute the compensation capacitor $C_p$.

An insulative layer is located on the positive electrode compensation area, and the sandwiched layer is the organic light emitting layer and the insulative layer, and the cathode, the positive electrode compensation area and the organic light emitting layer and the insulative layer between the cathode and the positive electrode compensation area constitute the compensation capacitor $C_p$.

Material of the insulative layer is silicon oxide, and a thickness of the insulative layer is smaller than a thickness of the flat layer.

Material of the positive electrode is Indium Tin Oxide.

Material of the flat layer is organic material.

Proportions of the positive electrode compensation areas of the red, the green, the blue sub pixel areas are different.

With the capacitance value $C_{total}$ required by the OLED drive circuit and the self capacitor $C_r$ of the OLED in the red sub pixel area, the compensation capacitor $C_p=C_{total}-C_r$ is calculated, and the proportion of the positive electrode compensation area of the red sub pixel area is calculated according to a parallel plate capacitor calculation formula.

With the capacitance value $C_{total}$ required by the OLED drive circuit and the self capacitor $C_g$ of the OLED in the green sub pixel area, the compensation capacitor $C_p=C_{total}-C_g$ is calculated, and the proportion of the positive electrode compensation area of the green sub pixel area is calculated according to a parallel plate capacitor calculation formula.

With the capacitance value $C_{total}$ required by the OLED drive circuit and the self capacitor $C_b$ of the OLED in the blue sub pixel area, the compensation capacitor $C_p=C_{total}-C_b$ is calculated, and the proportion of the positive electrode compensation area of the blue sub pixel area is calculated according to a parallel plate capacitor calculation formula.

The present invention further provides an OLED pixel structure, comprising red, green, blue sub pixel areas, and the red, the green, the blue sub pixel areas respectively comprise a substrate, an anode formed on the substrate, a flat layer formed on the anode, an organic light emitting layer formed on the flat layer and a cathode formed on the organic light emitting layer, and an aperture area is formed on the flat layer, and the organic light emitting layer contacts the anode through the aperture area, and the anode comprises a positive electrode and a positive electrode compensation area coupled to the positive electrode, and the cathode, the positive electrode compensation area and a sandwiched layer between the cathode and the positive electrode compensation area constitute a compensation capacitor $C_p$, and the compensation capacitor $C_p$ respectively makes total capacitance values of the red, green, blue sub pixel areas are equivalent to reach the capacitance value $C_{total}$ required by an OLED drive circuit;

wherein the sandwiched layer is the organic light emitting layer and the flat layer, and the cathode, the positive electrode compensation area and the organic light emitting layer and the flat layer between the cathode and the positive electrode compensation area constitute the compensation capacitor $C_p$;

wherein material of the positive electrode is Indium Tin Oxide.

The benefits of the present invention are: the OLED pixel structure of the present invention respectively calculates the compensation capacitors required by the red, the green, the blue sub pixel areas according to the total capacitance values required by the drive circuit of the OLED elements and the self capacitors of the OLEDs in the red, the green, the blue sub pixel areas. Then the demanded enlarged areas of the anodes of the red, the green, the blue sub pixel areas are respectively calculated according to a parallel plate capacitor calculation formula to manufacture the positive electrode compensation area so that the positive electrode compensation area, the anode and the sandwiched layer between the cathode and the positive electrode compensation area constitute a compensation capacitor. The compensation capacitors make the total capacitance values of the red, the green, the blue sub pixel areas are equivalent. Accordingly, the issue that the light emitting materials, the aperture ratios and attenuations of the red, the green, the blue sub pixel areas are different and thus the total capacitance values of the red, the green, the blue sub pixel areas are different can be solved. Meanwhile, the structure is simple and easy for manufacture.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
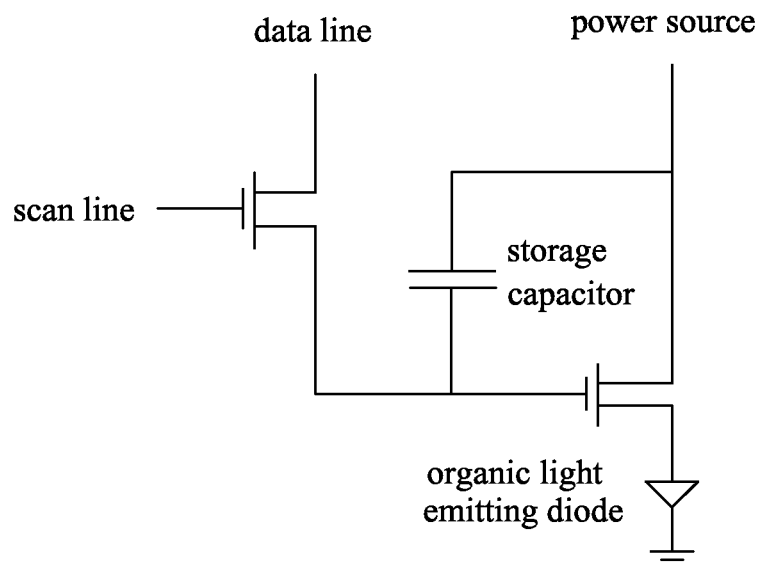
FIG. 1 is a drive circuit diagram of an OLED according to prior art.
Figure 2:
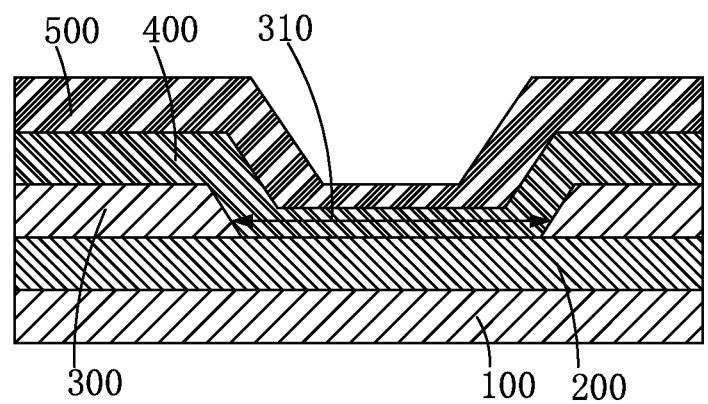
FIG. 2 is a sectional diagram of an OLED pixel structure according to prior art.
Figure 3:
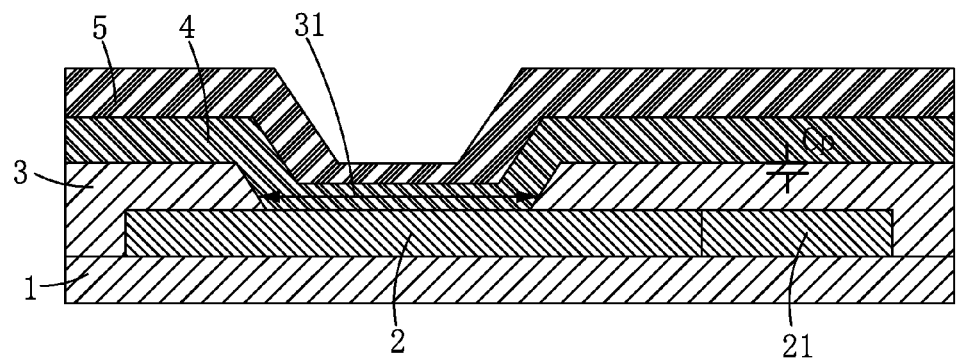
FIG. 3 is a diagram of an OLED pixel structure according to the first embodiment of the present invention.

Please refer to FIG. 3, which is an OLED pixel structure according to the first embodiment of the present invention. The OLED pixel structure comprises red, green, blue sub pixel areas, and the red, the green, the blue sub pixel areas respectively comprise a substrate 1, an anode formed on the substrate 1, a flat layer 3 formed on the anode, an organic light emitting layer 4 formed on the flat layer 3 and a cathode 5 formed on the organic light emitting layer 4, and an aperture area 31 is formed on the flat layer 3, and the organic light emitting layer 4 contacts the anode through the aperture area 31, and the anode comprises a positive electrode 2 and a positive electrode compensation area 21 coupled to the positive electrode 2, and the cathode 5, the positive electrode compensation area 21 and a sandwiched layer between the cathode 5 and the positive electrode compensation area 21 constitute a compensation capacitor $C_p$, and the compensation capacitor $C_p$ respectively makes total capacitance values of the red, green, blue sub pixel areas are equivalent to reach the capacitance value $C_{total}$ required by an OLED drive circuit.

Specifically, material of the positive electrode 2 is Indium Tin Oxide and material of the flat layer 3 is organic material.

Specifically, as shown in FIG. 3, in the capacitor compensation area, the sandwiched layer between the cathode 5 and the positive electrode compensation area 21 is the organic light emitting layer 4 and the flat layer 3, and the cathode 5, the positive electrode compensation area 21 and the organic light emitting layer 4 and the flat layer 3 between the cathode 5 and the positive electrode compensation area 21 constitute a compensation capacitor $C_p$.

Specifically, the respective organic light emitting layers 4, the aperture ratios of the red, the green, the blue sub pixel areas are different, and thus, the self capacitor values of the OLEDs in the respective sub pixel areas are different, either. For making all the total capacitance values of the respective sub pixel areas reach the capacitance value $C_{total}$ required by an OLED drive circuit, the compensation capacitor values $C_p$ required by respective sub pixel areas are different, and proportions of the positive electrode compensation areas 21 of the red, the green, the blue sub pixel areas are different, either.

Specifically, with the capacitance value $C_{total}$ required by the OLED drive circuit and the self capacitor $C_r$ of the OLED in the red sub pixel area, the compensation capacitor $Cp=C_{total}-C_r$ is calculated, and the proportion of the positive electrode compensation area of the red sub pixel area is calculated according to a parallel plate capacitor calculation formula;

With the capacitance value $C_{total}$ required by the OLED drive circuit and the self capacitor $C_g$ of the OLED in the green sub pixel area, the compensation capacitor $C_p=C_{total}-C_g$ is calculated, and the proportion of the positive electrode compensation area of the green sub pixel area is calculated according to a parallel plate capacitor calculation formula;

With the capacitance value $C_{total}$ required by the OLED drive circuit and the self capacitor $C_b$ of the OLED in the blue sub pixel area, the compensation capacitor $C_p=C_{total}-C_b$ is calculated, and the proportion of the positive electrode compensation area of the blue sub pixel area is calculated according to a parallel plate capacitor calculation formula.

Figure 4:
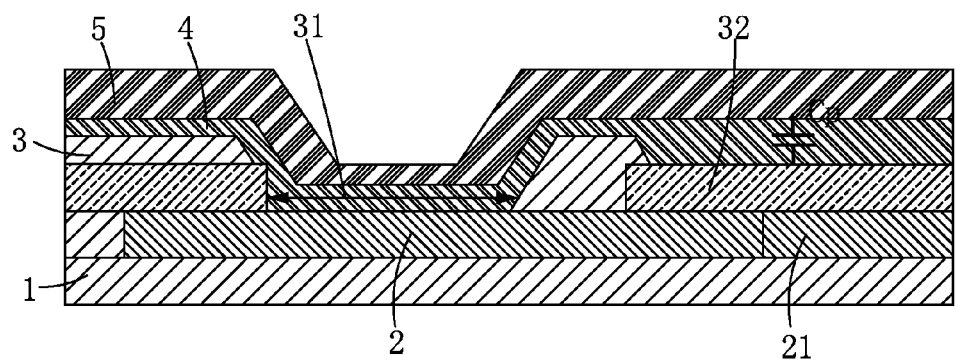
FIG. 4 is a diagram of an OLED pixel structure according to the second embodiment of the present invention.

Please refer to FIG. 4, which is an OLED pixel structure according to the second embodiment of the present invention. In the capacitor compensation area of the second embodiment, the sandwiched layer between the cathode 5 and the positive electrode compensation area 21 is the organic light emitting layer 4 and the insulative layer 32, and the cathode 5, the positive electrode compensation area 21 and the organic light emitting layer 4 and the insulative layer 32 between the cathode 5 and the positive electrode compensation area 21 constitute a compensation capacitor $C_p$; preferably, material of the insulative layer 32 is silicon oxide, and a thickness of the insulative layer 32 is smaller than a thickness of the flat layer 3.

As comparing the second embodiment with the first embodiment, the difference is: on the positive electrode compensation area 21, the insulative layer 32 is employed to replace the flat layer 3, and the insulative property of the insulative layer 32 is larger than the insulative property of the flat layer 3. Thus, under circumstance that the compensation capacitor $C_p$ is the same, the proportion of the positive electrode compensation area 21 in the second embodiment is smaller than the proportion of the positive electrode compensation area 21 in the second embodiment. Accordingly, the proportion of the positive electrode compensation area 21 required to manufacture is diminished, and the production cost and manufacture difficulty are lowered.

In the aforesaid pixel structure, by respectively locating the capacitor compensation areas in the red, the green, the blue sub pixel areas, the capacitor compensation area comprises the positive electrode compensation area coupled to the positive electrode, the cathode and the sandwiched layer between the cathode and the positive electrode compensation area. The aforesaid sandwiched layer structure constitutes the compensation capacitors $C_p$ of the red, the green, the blue sub pixel areas. The compensation capacitors $C_p$ respectively make all the total capacitance values of the red, the green, the blue sub pixel areas reach the capacitance value $C_{total}$ required by the drive circuit of the OLED element.

In conclusion, the OLED pixel structure of the present invention respectively calculates the compensation capacitors required by the red, the green, the blue sub pixel areas according to the total capacitance values required by the drive circuit of the OLED elements and the self capacitors of the OLEDs in the red, the green, the blue sub pixel areas. Then the demanded enlarged areas of the anodes of the red, the green, the blue sub pixel areas are respectively calculated according to a parallel plate capacitor calculation formula to manufacture the positive electrode compensation area so that the positive electrode compensation area, the anode and the sandwiched layer between the cathode and the positive electrode compensation area constitute a compensation capacitor. The compensation capacitors make the total capacitance values of the red, the green, the blue sub pixel areas are equivalent. Accordingly, the issue that the light emitting materials, the aperture ratios and attenuations of the red, the green, the blue sub pixel areas are different and thus the total capacitance values of the red, the green, the blue sub pixel areas are different can be solved. Meanwhile, the structure is simple and easy for manufacture.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An organic light emitting diode (OLED) pixel structure, comprising:
a red, a green, and a blue sub pixel areas, each of which comprises a substrate, an anode formed on the substrate, a flat layer formed on the anode, an organic light emitting layer formed on the flat layer and a cathode formed on the organic light emitting layer, wherein an aperture area is formed in the flat layer, and the organic light emitting layer contacts the anode through the aperture area, and the anode comprises a positive electrode and a positive electrode compensation area coupled to the positive electrode, such that the cathode, the positive electrode compensation area and a sandwiched layer between the cathode and the positive electrode compensation area constitute a compensation capacitor $C_p$, wherein the compensation capacitor $C_p$ of each of the red, green, and blue sub pixel areas is such that a total capacitance value of each of the red, green, and blue sub pixel areas is equivalent to one another.

2. The OLED pixel structure according to claim 1, wherein the sandwiched layer comprises a portion of the organic light emitting layer and a portion of the flat layer, such that the cathode, the positive electrode compensation area, and the portion of the organic light emitting layer and the portion of the flat layer between the cathode and the positive electrode compensation area constitute the compensation capacitor $C_p$.

3. The OLED pixel structure according to claim 1, wherein an insulative layer is located on the positive electrode compensation area, and the sandwiched layer comprises a portion of the organic light emitting layer and the insulative layer, such that the cathode, the positive electrode compensation area, and the portion of the organic light emitting layer and the insulative layer between the cathode and the positive electrode compensation area constitute the compensation capacitor $C_p$.

4. The OLED pixel structure according to claim 3, wherein a material of the insulative layer is silicon oxide, and a thickness of the insulative layer is smaller than a thickness of the flat layer.

5. The OLED pixel structure according to claim 1, wherein a material of the positive electrode is Indium Tin Oxide.

6. The OLED pixel structure according to claim 1, wherein a material of the flat layer is an organic material.

7. The OLED pixel structure according to claim 1, wherein the positive electrode compensation areas of the red, the green, and the blue sub pixel areas are different.

8. The OLED pixel structure according to claim 7, wherein with the red sub pixel area has an inherent capacitance, a capacitance of the compensation capacitor $C_p$ of the red sub pixel area is determined by subtracting the inherent capacitance from the total capacitance value, and the positive electrode compensation area of the red sub pixel area is determined according to the capacitance of the compensation capacitor of the red sub pixel area by following a parallel plate capacitor calculation formula.

9. The OLED pixel structure according to claim 7, wherein the OLED in the green sub pixel area has an inherent capacitance, a capacitance of the compensation capacitor $C_p$ of the green sub pixel area is determined by subtracting the inherent capacitance from the total capacitance value, and the positive electrode compensation area of the green sub pixel area is determined according to the capacitance of the compensation capacitor of the green sub pixel area by following a parallel plate capacitor calculation formula.

10. The OLED pixel structure according to claim 7, wherein the OLED in the blue sub pixel area has an inherent capacitance, a capacitance of the compensation capacitor $C_p$ of the blue sub pixel area is determined by subtracting the inherent capacitance from the total capacitance value, and the positive electrode compensation area of the blue sub pixel area is determined according to the capacitance of the compensation capacitor of the blue sub pixel area by following a parallel plate capacitor calculation formula.

11. An organic light emitting diode (OLED) pixel structure, comprising:
a red, a green, and a blue sub pixel areas, each of which comprises a substrate, an anode formed on the substrate, a flat layer formed on the anode, an organic light emitting layer formed on the flat layer and a cathode formed on the organic light emitting layer, wherein an aperture area is formed in the flat layer, and the organic light emitting layer contacts the anode through the aperture area, and the anode comprises a positive electrode and a positive electrode compensation area coupled to the positive electrode, such that the cathode, the positive electrode compensation area and a sandwiched layer between the cathode and the positive electrode compensation area constitute a compensation capacitor $C_p$, wherein the compensation capacitor $C_p$ of each of the red, green, and blue sub pixel areas is such that a total capacitance value of each of the red, green, and blue sub pixel areas is equivalent to one another;

wherein the sandwiched layer comprises a portion of the organic light emitting layer and a portion of the flat layer, such that the cathode, the positive electrode compensation area, and the portion of the organic light emitting layer and the portion of the flat layer between the cathode and the positive electrode compensation area constitute the compensation capacitor $C_p$; and wherein a material of the positive electrode is Indium Tin Oxide.

12. The OLED pixel structure according to claim 11, wherein a material of the flat layer is an organic material.

13. The OLED pixel structure according to claim 11, wherein of positive electrode compensation areas of the red, the green, and the blue sub pixel areas are different.

14. The OLED pixel structure according to claim 13, wherein with the red sub pixel area has an inherent capacitance, a capacitance of the compensation capacitor $C_p$ of the red sub pixel area is determined by subtracting the inherent capacitance from the total capacitance value, and the positive electrode compensation area of the red sub pixel area is determined according to the capacitance of the compensation capacitor of the red sub pixel area by following a parallel plate capacitor calculation formula.

15. The OLED pixel structure according to claim 13, wherein the green sub pixel area has an inherent capacitance, a capacitance of the compensation capacitor $C_p$ of the green sub pixel area is determined by subtracting the inherent capacitance from the total capacitance value, and the positive electrode compensation area of the green sub pixel area is determined according to the capacitance of the compensation capacitor of the green sub pixel area by following a parallel plate capacitor calculation formula.

16. The OLED pixel structure according to claim 13, wherein the blue sub pixel area has an inherent capacitance, a capacitance of the compensation capacitor $C_p$ of the blue sub pixel area is determined by subtracting the inherent capacitance from the total capacitance value, and the positive electrode compensation area of the blue sub pixel area is determined according to the capacitance of the compensation capacitor of the blue sub pixel area by following a parallel plate capacitor calculation formula.

* * * * *